US011316442B2

(12) United States Patent
Yang et al.

(10) Patent No.: US 11,316,442 B2
(45) Date of Patent: Apr. 26, 2022

(54) SWITCH-MODE POWER CONVERTERS USING HALL EFFECT SENSORS AND METHODS THEREOF

(71) Applicant: ON-BRIGHT ELECTRONICS (SHANGHAI) CO., LTD., Shanghai (CN)

(72) Inventors: Senlin Yang, Shanghai (CN); Qiang Luo, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/118,815

(22) Filed: Dec. 11, 2020

(65) Prior Publication Data
US 2021/0099099 A1    Apr. 1, 2021

Related U.S. Application Data

(62) Division of application No. 16/276,476, filed on Feb. 14, 2019, now abandoned.

(30) Foreign Application Priority Data

Dec. 7, 2018    (CN) .......................... 201811494071.6

(51) Int. Cl.
*H02M 7/217*    (2006.01)
*G01R 33/07*    (2006.01)

(52) U.S. Cl.
CPC ............ *H02M 7/217* (2013.01); *G01R 33/07* (2013.01)

(58) Field of Classification Search
CPC .. G01R 15/202; G01R 33/0094; G01R 33/07; G01R 33/072; H02M 3/33523; H02M 3/33592; H02M 7/217; H02M 3/28
See application file for complete search history.

(56) References Cited

U.S. PATENT DOCUMENTS 9,275,946 B2    3/2016  Balakrishnan et al.
10,128,832 B2   11/2018  Xu et al.
(Continued)

FOREIGN PATENT DOCUMENTS

CN    104038066 A    9/2014
CN    104821726 A    8/2015
(Continued)

OTHER PUBLICATIONS

China Intellectual Property Office, Office Action dated Jul. 2, 2020, for Application No. 201811494071.6.
(Continued)

*Primary Examiner* — Jay Patidar
(74) *Attorney, Agent, or Firm* — Faegre Drinker Biddle & Reath

(57) ABSTRACT

System and method for a power converter. For example, the system includes a first controller; a first transmitter; a first receiver; one or more first wires; one or more second wires; a second controller; a second receiver connected to the first transmitter through the one or more first wires; and a second transmitter connected to the first receiver through the one or more second wires. The first controller is configured to output a first control signal to a first switch to affect a first current flowing through a primary winding of a power converter; and generate a first input signal. The first transmitter is configured to receive the first input signal and generate the first current. The second receiver includes a first coil configured to generate a first magnetic field based at least in part on the first current flowing through the first coil.

4 Claims, 9 Drawing Sheets

(56) References Cited

U.S. PATENT DOCUMENTS

| | | |
|---|---|---|
| 2012/0133356 A1 | 5/2012 | Charlier et al. |
| 2013/0272036 A1 | 10/2013 | Fang |
| 2014/0334186 A1 | 11/2014 | Lin |
| 2017/0310229 A1* | 10/2017 | Fujisaki ............ H02M 3/33507 |
| 2018/0152099 A1 | 5/2018 | Savic et al. |
| 2018/0337600 A1 | 11/2018 | Neumayr et al. |
| 2020/0186050 A1 | 6/2020 | Yang et al. |

FOREIGN PATENT DOCUMENTS

| | | |
|---|---|---|
| CN | 107231095 A | 10/2017 |
| CN | 207010540 U | 2/2018 |
| CN | 105359414 B | 7/2018 |
| CN | 207625446 U | 7/2018 |
| JP | 2008-289267 A | 11/2008 |
| TW | 201351087 A | 12/2013 |
| TW | 201701578 A | 1/2017 |

OTHER PUBLICATIONS

China Intellectual Property Office, Office Action dated Dec. 16, 2020, for Application No. 201811494071.6.

Taiwan Patent Office, Office Action dated Sep. 3, 2019, for Application No. 108101205.

United States Patent and Trademark Office, Office Action dated Aug. 17, 2020, for U.S. Appl. No. 16/276,476.

\* cited by examiner

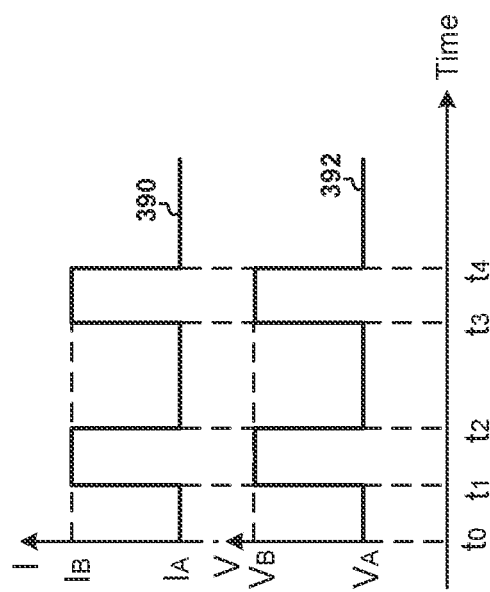

ic devices. As an example, the power
SWITCH-MODE POWER CONVERTERS USING HALL EFFECT SENSORS AND METHODS THEREOF

1. CROSS-REFERENCES TO RELATED APPLICATIONS

This application is a divisional of U.S. patent application Ser. No. 16/276,476, filed Feb. 14, 2019, which claims priority to Chinese Patent Application No. 201811494071.6, filed Dec. 7, 2018, both applications being incorporated by reference herein for all purposes.

2. BACKGROUND OF THE INVENTION

Certain embodiments of the present invention are directed to integrated circuits. More particularly, some embodiments of the invention provide power converters using Hall effect sensors and methods thereof. Merely by way of example, some embodiments of the invention have been applied to switch-mode power converters. But it would be recognized that the invention has a much broader range of applicability.

Power converters are widely used for consumer electronics such as portable devices. As an example, the power converters can convert electric power from one form to another form, such as from alternate current (AC) to direct current (DC), from DC to AC, from AC to AC, or from DC to DC. Some of the power converters are switch-mode converters.

Usually, an AC-to-DC switch-mode converter includes the primary side and the secondary side. The primary side often receives an AC voltage that may be as high as 110 volts or 220 volts, and the secondary side often generates a DC voltage that usually falls within a range of human safety. In order to ensure safety of the AC-to-DC switch-mode converter, the primary side and the secondary side often communicate in a way that avoids any undesirable electrical connection between the primary side and the secondary side. For example, the primary side and the secondary side communicate through a transformer, an optical coupler, and/or a high-voltage Y capacitor, but such as configurations usually are difficult to integrate, incur high cost, and/or provide low reliability.

FIG. 1 is a simplified diagram showing a conventional AC-to-DC switch-mode power converter. The AC-to-DC switch-mode power converter 100 includes a controller 110, a controller 120, and a transformer. The controller 110 is used for primary side regulation (PSR), and the controller 120 is used for secondary side regulation (SSR). Additionally, the transformer includes a primary winding 130, the secondary winding 132, and an auxiliary winding 134.

As shown in FIG. 1, the controller 110 and the controller 120 often communicate through the transformer in order to perform synchronous rectification. If the controller 110 and the controller 120 attempt to control the transformer at the same time, the transformer may suffer from short circuit, therefore reducing system reliability.

FIG. 2 is a simplified diagram showing a conventional system including a Hall effect sensor. The system 200 includes a coil 210, wires 212 and 214, a current source 220, a Hall effect sensor 230, a current source 240, and wires 242 and 244. The Hall effect sensor 230 includes electrodes 232, 234, 236, and 238. The coil 210 is used to generate a magnetic field, and the Hall effect sensor 230 is used to sense the magnetic field. The coil 210 is electrically isolated (e.g., by one or more dielectric layers) from the Hall effect sensor 230 and the wires 242 and 244.

As shown in FIG. 2, the current source 220 provides a current 222 that flows from the wire 212 to the wire 214 through the coil 210 and generates the magnetic field (e.g., the magnetic field perpendicular to the Hall effect sensor 230). The wire 212 is connected directly to the coil 210, and the coil 210 is connected directly to the wire 214. The magnetic field penetrates through the Hall effect sensor 230, and the Hall effect sensor 230 is located within the magnetic field.

Additionally, the current source 240 provides a current 246 that flows from the wire 242 to the wire 244 through the Hall effect sensor 230. The wire 242 is connected directly to the electrode 232 of the Hall effect sensor 230, and the electrode 236 of the Hall effect sensor 230 is connected directly to the wire 244. The wire 244 is biased to a ground voltage. In more detail, within the Hall effect sensor 230, the current 246 flows from the electrode 232 to the electrode 236 under the magnetic field, generating a voltage between the electrodes 234 and 238. The generated voltage is equal to the voltage level of the electrode 238 minus the voltage level of the electrode 234, and the generated voltage depends on the magnetic field that is generated by the current 222 flowing through the coil 210.

As an alternative, the current source 220 provides the current 222 that flows from the wire 214 to the wire 212 through the coil 210. As another alternative, the current source 240 provides the current 246 that flows from the wire 244 to the wire 242 through the Hall effect sensor 230 so that the current 246 flows from the electrode 236 to the electrode 232. As yet another alternative, the current source 220 provides the current 222 that flows from the wire 214 to the wire 212 through the coil 210, and the current source 240 provides the current 246 that flows from the wire 244 to the wire 242 through the Hall effect sensor 230 so that the current 246 flows from the electrode 236 to the electrode 232.

Referring to FIG. 1, the conventional AC-to-DC switch-mode power converter often suffers from low system reliability. Hence it is highly desirable to improve the techniques of switch-mode power converters.

3. BRIEF SUMMARY OF THE INVENTION

Certain embodiments of the present invention are directed to integrated circuits. More particularly, some embodiments of the invention provide power converters using Hall effect sensors and methods thereof. Merely by way of example, some embodiments of the invention have been applied to switch-mode power converters. But it would be recognized that the invention has a much broader range of applicability.

According to certain embodiments, a system for transmitting and receiving includes a transmitter, one or more wires, and a receiver connected to the transmitter through the one or more wires. The transmitter is configured to generate a first current, and the receiver is configured to receive the first current. The receiver includes a coil, a Hall effect sensor, and a comparator, and the Hall effect sensor includes a first electrode and a second electrode. The coil is electrically isolated from the Hall effect sensor and configured to generate a magnetic field based at least in part on the first current flowing through the coil, and the Hall effect sensor is configured to sense the magnetic field and generate a first voltage at the first electrode and a second voltage at the second electrode. The comparator includes a first input terminal and a second input terminal. The comparator is configured to receive the first voltage at the first input terminal, receive the second voltage at the second input terminal, and generate an output voltage based at least in part on the first voltage and the second voltage.

According to some embodiments, a system for a power converter includes a first controller system including a first controller and a transmitter, one or more wires, and a second controller system connected to the first controller system through the one or more wires. The second controller system includes a second controller and a receiver. The first controller is configured to output a first control signal to a first switch to affect a first current flowing through a primary winding of a power converter, and generate an input signal. The transmitter is configured to receive the input signal and generate a current in response to the input signal. The receiver includes a coil configured to generate a magnetic field based at least in part on the current flowing through the coil, a Hall effect sensor configured to sense the magnetic field, and a comparator configured to receive a first sensor voltage and a second sensor voltage from the Hall effect sensor. The receiver is configured to receive the current and generate an output signal based at least in part on the current. The second controller is configured to receive the output signal, and output a second control signal to a second switch to affect a second current flowing through a secondary winding of the power converter. The secondary winding is coupled to the primary winding.

According to certain embodiments, a system for a power converter includes a first controller system including a first controller and a receiver, one or more wires, and a second controller system connected to the first controller system through the one or more wires, the second controller system including a second controller and a transmitter. The second controller is configured to output a first control signal to a first switch to affect a first current flowing through a secondary winding of a power converter, and generate an input signal. The transmitter is configured to receive the input signal and generate a current in response to the input signal. The receiver includes a coil configured to generate a magnetic field based at least in part on the current flowing through the coil, a Hall effect sensor configured to sense the magnetic field, and a comparator configured to receive a first sensor voltage and a second sensor voltage from the Hall effect sensor. The receiver is configured to receive the current and generate an output signal based at least in part on the current. The first controller is configured to: receive the output signal, and output a second control signal to a second switch to affect a second current flowing through a primary winding of the power converter. The primary winding is coupled to the secondary winding.

According to some embodiments, a system for a power converter includes a first controller, a first transmitter, a first receiver, one or more first wires, one or more second wires, a second controller, a second receiver connected to the first transmitter through the one or more first wires, and a second transmitter connected to the first receiver through the one or more second wires. The first controller is configured to: output a first control signal to a first switch to affect a first current flowing through a primary winding of a power converter; and generate a first input signal. The first transmitter is configured to receive the first input signal and generate a first current in response to the first input signal. The second receiver includes a first coil configured to generate a first magnetic field based at least in part on the first current flowing through the first coil, a first Hall effect sensor configured to sense the first magnetic field, and a first comparator configured to receive a first sensor voltage and a second sensor voltage from the first Hall effect sensor. The second receiver is configured to receive the first current and generate a first output signal based at least in part on the first current. The second controller is configured to: receive the first output signal; output a second control signal to a second switch to affect a second current flowing through a secondary winding of the power converter, the secondary winding being coupled to the primary winding; and generate a second input signal. The second transmitter is configured to receive the second input signal and generate a second current in response to the second input signal. The first receiver includes a second coil configured to generate a second magnetic field based at least in part on the second current flowing through the second coil, a second Hall effect sensor configured to sense the second magnetic field, and a second comparator configured to receive a third sensor voltage and a fourth sensor voltage from the second Hall effect sensor. The first receiver is configured to receive the second current and generate a second output signal based at least in part on the second current. The first controller is configured to receive the second output signal.

According to certain embodiments, a method for transmitting and receiving includes generating a first current, receiving the first current, generating, by a coil, a magnetic field based at least in part on the first current flowing through the coil, and sensing the magnetic field by a Hall effect sensor. The Hall effect sensor is electrically isolated from the coil. Additionally, the method includes generating a first voltage and a second voltage by the Hall effect sensor, receiving the first voltage and the second voltage, and generating an output voltage based at least in part on the first voltage and the second voltage.

According to some embodiments, a method for a power converter includes outputting a first control signal to a first switch to affect a first current flowing through a primary winding of a power converter, generating an input signal, receiving the input signal, generating a current in response to the input signal, and receiving the current. Additionally, the method includes generating a magnetic field by a coil based at least in part on the current flowing through the coil, sensing the magnetic field by a Hall effect sensor, receiving a first sensor voltage and a second sensor voltage from the Hall effect sensor, and generating an output signal based at least in part on the first sensor voltage and the second sensor voltage. Moreover, the method includes receiving the output signal, and outputting a second control signal to a second switch to affect a second current flowing through a secondary winding of the power converter. The secondary winding is coupled to the primary winding.

According to certain embodiments, a method for a power converter includes outputting a first control signal to a first switch to affect a first current flowing through a secondary winding of a power converter, generating an input signal, receiving the input signal, generating a current in response to the input signal, and receiving the current. Additionally, the method includes generating a magnetic field, by a coil, based at least in part on the current flowing through the coil, sensing the magnetic field by a Hall effect sensor, receiving a first sensor voltage and a second sensor voltage from the Hall effect sensor, and generating an output signal based at least in part on the first sensor voltage and the second sensor voltage. Moreover, the method includes receiving the output signal, and outputting a second control signal to a second switch to affect a second current flowing through a primary winding of the power converter. The primary winding is coupled to the secondary winding.

According to some embodiments, a method for a power converter includes outputting a first control signal to a first switch to affect a first current flowing through a primary winding of a power converter, generating a first input signal, receiving the first input signal, generating a first current in response to the first input signal, and receiving the first current. Additionally, the method includes generating a first magnetic field, by a first coil, based at least in part on the first current flowing through the first coil, sensing the first magnetic field by a first Hall effect sensor, receiving a first sensor voltage and a second sensor voltage from the first Hall effect sensor, generating a first output signal based at least in part on the first sensor voltage and the second sensor voltage, receiving the first output signal, and outputting a second control signal to a second switch to affect a second current flowing through a secondary winding of the power converter. The secondary winding is coupled to the primary winding. Moreover, the method includes generating a second input signal, receiving the second input signal, and generating a second current in response to the second input signal, receiving the second current. Also, the method includes generating a second magnetic field, by a second coil, based at least in part on the second current flowing through the second coil, sensing the second magnetic field by a second Hall effect sensor, receiving a third sensor voltage and a fourth sensor voltage from the second Hall effect sensor, generating a second output signal based at least in part on the third sensor voltage and the fourth sensor voltage, and receiving the second output signal.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

FIG. 3B is a simplified timing diagram for the transmitting and receiving system as shown in FIG. 3A according to an embodiment of the present invention.

5. DETAILED DESCRIPTION OF THE INVENTION

Certain embodiments of the present invention are directed to integrated circuits. More particularly, some embodiments of the invention provide power converters using Hall effect sensors and methods thereof. Merely by way of example, some embodiments of the invention have been applied to switch-mode power converters. But it would be recognized that the invention has a much broader range of applicability.

Figure 1:
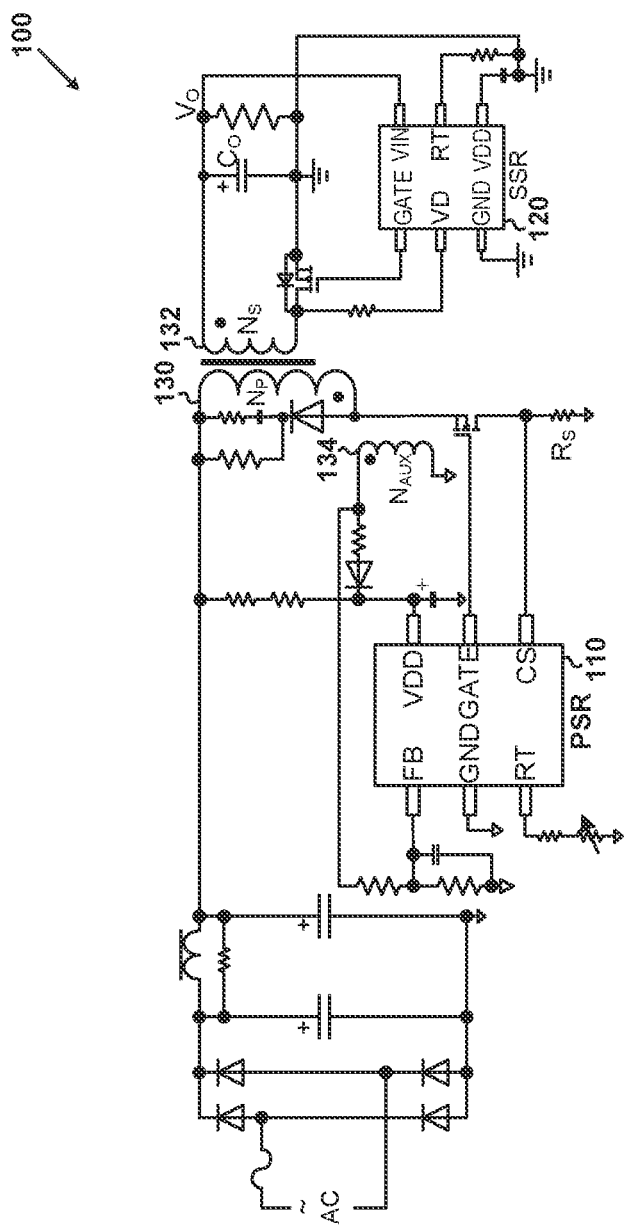
FIG. 1 is a simplified diagram showing a conventional AC-to-DC switch-mode power converter.
Figure 2:
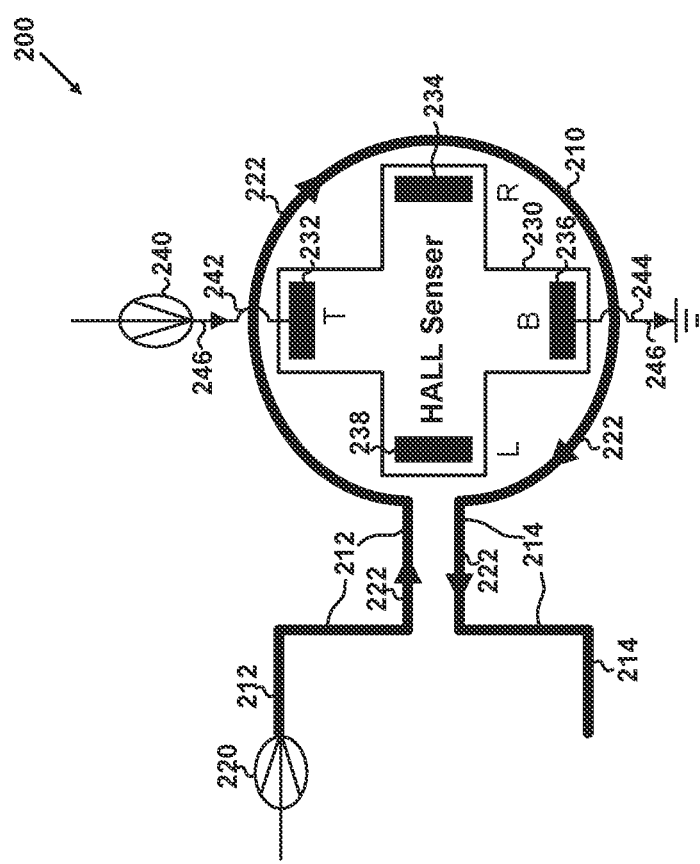
FIG. 2 is a simplified diagram showing a conventional system including a Hall effect sensor.
Figure 3A:
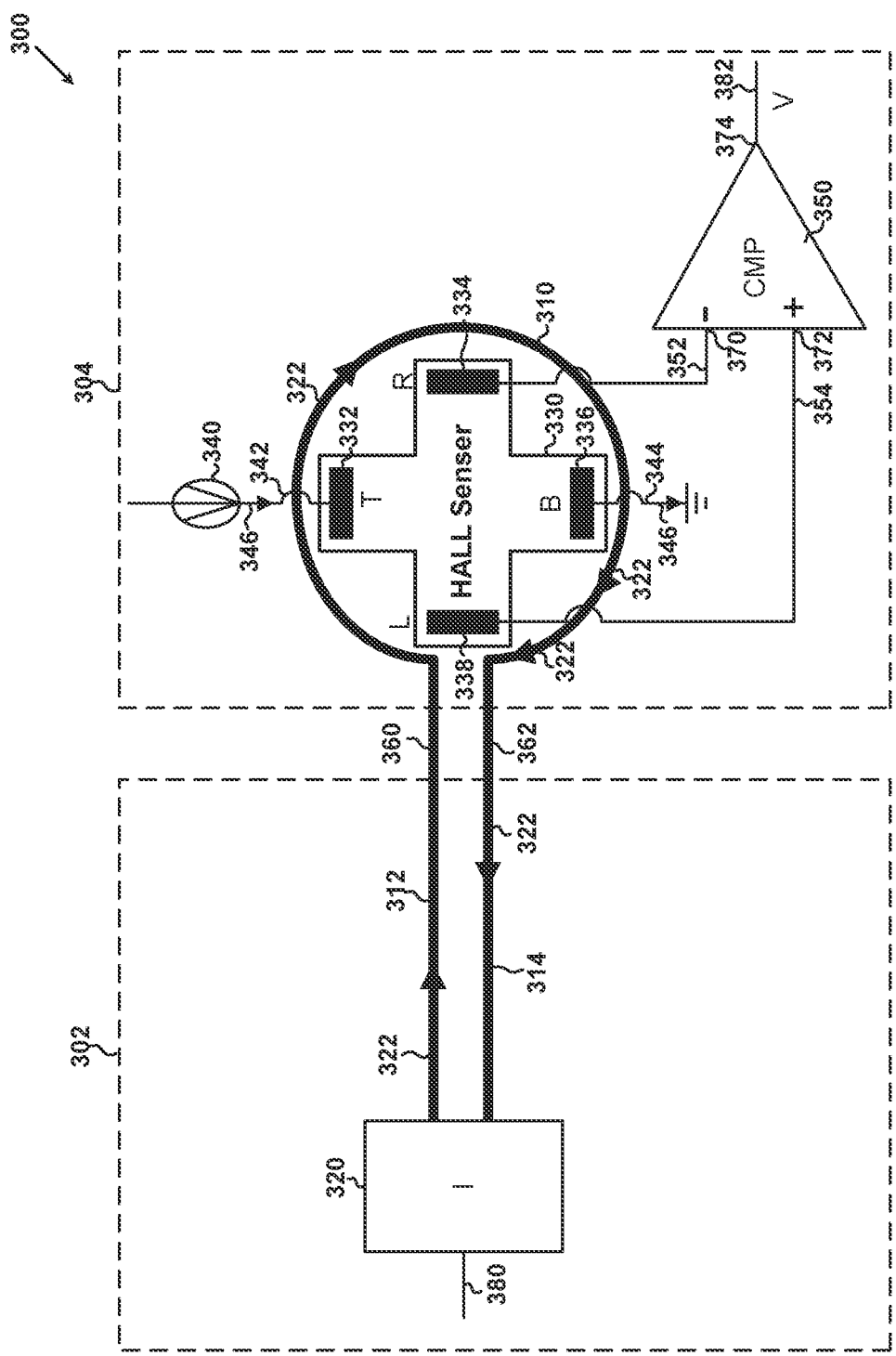
FIG. 3A is a simplified diagram showing a transmitting and receiving system including a Hall effect sensor according to one embodiment of the present invention.

FIG. 3A is a simplified diagram showing a transmitting and receiving system including a Hall effect sensor according to one embodiment of the present invention. This diagram is merely an example, which should not unduly limit the scope of the claims. One of ordinary skill in the art would recognize many variations, alternatives, and modifications. The transmitting and receiving system 300 includes a transmitter 302, a receiver 304, and wires 360 and 362. In some examples, the transmitter 302 includes wires 312 and 314 and a current source 320. In certain examples, the receiver 304 includes a coil 310, a Hall effect sensor 330, a current source 340, wires 342 and 344, a comparator 350, and wires 352 and 354. For example, the transmitter 302 and the receiver 304 are connected to each other by the wires 360 and 362. As an example, the Hall effect sensor 330 includes electrodes 332, 334, 336, and 338.

In some embodiments, the transmitter 302 is located on a chip, and the receiver 304 is located on another chip. For example, the chip for the transmitter 302 and the chip for the receiver 304 are connected to each other by the wires 360 and 362. In certain embodiments, the transmitter 302 and the receiver 304 are located on a same chip. For example, the transmitter 302 and the receiver 304 are connected to each other by the wires 360 and 362 within the same chip. In some embodiments, the coil 310 is used to generate a magnetic field, and the Hall effect sensor 330 is used to sense the magnetic field. In certain embodiments, the coil 310 is electrically isolated (e.g., by one or more dielectric layers) from the Hall effect sensor 330 and the wires 342, 344, 352, and 354.

As shown in FIG. 3A, the current source 320 receives an input signal 380 and generates a current 322 in response to the input signal 380, and the current 322 flows from the wire 312 to the wire 314 through the wire 360, the coil 310, and the wire 362 and generates the magnetic field (e.g., the magnetic field perpendicular to the Hall effect sensor 330), according to some embodiments. For example, the wire 312 is connected directly to the wire 360, the wired 360 is connected directly to the coil 310, the coil 310 is connected directly to the wire 362, and the wire 362 is connected directly to the wire 314. As an example, the magnetic field penetrates through the Hall effect sensor 330, and the Hall effect sensor 330 is located within the magnetic field.

According to certain embodiments, the current source 340 provides a current 346 that flows from the wire 342 to the wire 344 through the Hall effect sensor 330. In some examples, the wire 342 is connected directly to the electrode 332 of the Hall effect sensor 330, and the electrode 336 of the Hall effect sensor 330 is connected directly to the wire 344. As an example, the wire 344 is biased to a ground voltage (e.g., a primary-side ground voltage, a secondary-side ground voltage). In certain examples, within the Hall effect sensor 330, the current 346 flows from the electrode 332 to the electrode 336 under the magnetic field, generating a voltage between the electrodes 334 and 338. As an example, the generated voltage is equal to the voltage level of the electrode 338 minus the voltage level of the electrode 334. For example, the generated voltage depends on the magnetic field that is generated by the current 322 flowing through the coil 310.

As shown in FIG. 3A, the wire 352 is connected directly to the electrode 334, and the wire 354 is connected directly to the electrode 338, according to some embodiments. In certain examples, the comparator 350 includes input terminals 370 and 372, and an output terminal 374. In some examples, the input terminal 370 (e.g., a negative electrode) of the comparator 350 receives the voltage level of the electrode 334 through the wire 352, and the input terminal 372 (e.g., a positive electrode) of the comparator 350 receives the voltage level of the electrode 338 through the wire 354. In certain examples, the comparator 350 generates an output voltage 382 at the output terminal 374. For example, if the voltage level of the electrode 338 is higher than the voltage level of the electrode 334, the output voltage 382 is at a logic high level. As an example, if the voltage level of the electrode 338 is lower than the voltage level of the electrode 334, the output voltage 382 is at a logic low level.

As shown in FIG. 3A, the transmitter 302 receives the input signal 380, generates the current 322 in response to the input signal 380, and transmits the current 322 to the receiver 304, and the receiver 304 receives the current 322, generates the output voltage 382 in response to the current 322, and outputs the output voltage 382.

As discussed above and further emphasized here, FIG. 3A is merely an example, which should not unduly limit the scope of the claims. One of ordinary skill in the art would recognize many variations, alternatives, and modifications. For example, the wire 344 is biased to a primary-side ground voltage. As an example, the wire 344 is biased to a secondary-side ground voltage.

FIG. 3B is a simplified timing diagram for the transmitting and receiving system 300 according to an embodiment of the present invention. This diagram is merely an example, which should not unduly limit the scope of the claims. One of ordinary skill in the art would recognize many variations, alternatives, and modifications. The waveform 390 represents the current 322 as a function of time, and the waveform 392 represents the output voltage 382 as a function of time.

In some examples, from time $t_0$ to time $t_1$, the current 322 remains at a current level $I_A$ (e.g., at a current level representing a logic low level) as shown by the waveform 390, and the output voltage 382 remains at a voltage level $V_A$ (e.g., at a voltage level representing a logic low level) as shown by the waveform 392.

In certain examples, at time $t_1$, the current 322 changes from the current level $I_A$ (e.g., at the current level representing the logic low level) to a current level $I_B$ (e.g., at a current level representing a logic high level) as shown by the waveform 390, and the output voltage 382 changes from the voltage level $V_A$ (e.g., at the voltage level representing the logic low level) to a voltage level $V_B$ (e.g., at a voltage level representing a logic high level) as shown by the waveform 392.

In some examples, from time $t_1$ to time $t_2$, the current 322 remains at the current level $I_B$ (e.g., at the current level representing the logic high level) as shown by the waveform 390, and the output voltage 382 remains at the voltage level $V_B$ (e.g., at the voltage level representing the logic high level) as shown by the waveform 392.

In certain examples, at time $t_2$, the current 322 changes from the current level $I_B$ (e.g., at the current level representing the logic high level) to the current level $I_A$ (e.g., at the current level representing the logic low level) as shown by the waveform 390, and the output voltage 382 changes from the voltage level $V_B$ (e.g., at the voltage level representing the logic high level) to the voltage level $V_A$ (e.g., at the voltage level representing the logic high level) as shown by the waveform 392.

In some examples, from time $t_2$ to time $t_3$, the current 322 remains at the current level $I_A$ (e.g., at the current level representing the logic low level) as shown by the waveform 390, and the output voltage 382 remains at the voltage level $V_A$ (e.g., at the voltage level representing the logic low level) as shown by the waveform 392.

In certain examples, at time $t_3$, the current 322 changes from the current level $I_A$ (e.g., at the current level representing the logic low level) to the current level $I_B$ (e.g., at the current level representing the logic high level) as shown by the waveform 390, and the output voltage 382 changes from the voltage level $V_A$ (e.g., at the voltage level representing the logic low level) to the voltage level $V_B$ (e.g., at the voltage level representing the logic high level) as shown by the waveform 392.

In some examples, from time $t_3$ to time $t_4$, the current 322 remains at the current level $I_B$ (e.g., at the current level representing the logic high level) as shown by the waveform 390, and the output voltage 382 remains at the voltage level $V_B$ (e.g., at the voltage level representing the logic high level) as shown by the waveform 392.

In certain examples, at time $t_4$, the current 322 changes from the current level $I_B$ (e.g., at the current level representing the logic high level) to the current level $I_A$ (e.g., at the current level representing the logic low level) as shown by the waveform 390, and the output voltage 382 changes from the voltage level $V_B$ (e.g., at the voltage level representing the logic high level) to the voltage level $V_A$ (e.g., at the voltage level representing the logic high level) as shown by the waveform 392.

In some examples, after time $t_4$, the current 322 remains at the current level $I_A$ (e.g., at the current level representing the logic low level) as shown by the waveform 390, and the output voltage 382 remains at the voltage level $V_A$ (e.g., at the voltage level representing the logic low level) as shown by the waveform 392.

As shown in FIG. 3B, if the current 322 is at the logic high level, the output voltage 382 is also at the logic high level, and if the current 322 is at the logic low level, the output voltage 382 is also at the logic low level, according to some embodiments. For example, the output voltage 382 is at the same logic level as the current 322. As an example, the chip for the transmitter 302 sends the current 322 to the chip for the receiver 304, and the chip for the receiver 304 receives the current 322 and generates the output voltage 382 that has the same logic level as the current 322. According to certain embodiments, if the current 322 includes one or more pulses, the output voltage 382 also includes one or more corresponding pulses, achieving communications from the transmitter 302 to the receiver 304 (e.g., from the chip for the transmitter 302 to the chip for the receiver 304).

As mentioned above and further emphasized here, FIGS. 3A and 3B are merely examples, which should not unduly limit the scope of the claims. One of ordinary skill in the art would recognize many variations, alternatives, and modifications. For example, the current source 320 provides the current 322 that flows from the wire 314 to the wire 312 through the wire 362, the coil 310, and the wire 360. As an example, the current source 340 provides the current 346 that flows from the wire 344 to the wire 342 through the Hall effect sensor 330 so that the current 346 flows from the electrode 336 to the electrode 332. In some examples, the current source 320 provides the current 322 that flows from the wire 314 to the wire 312 through the wire 362, the coil 310, and the wire 360, and the current source 340 provides the current 346 that flows from the wire 344 to the wire 342 through the Hall effect sensor 330 so that the current 346 flows from the electrode 336 to the electrode 332.

Figure 4:
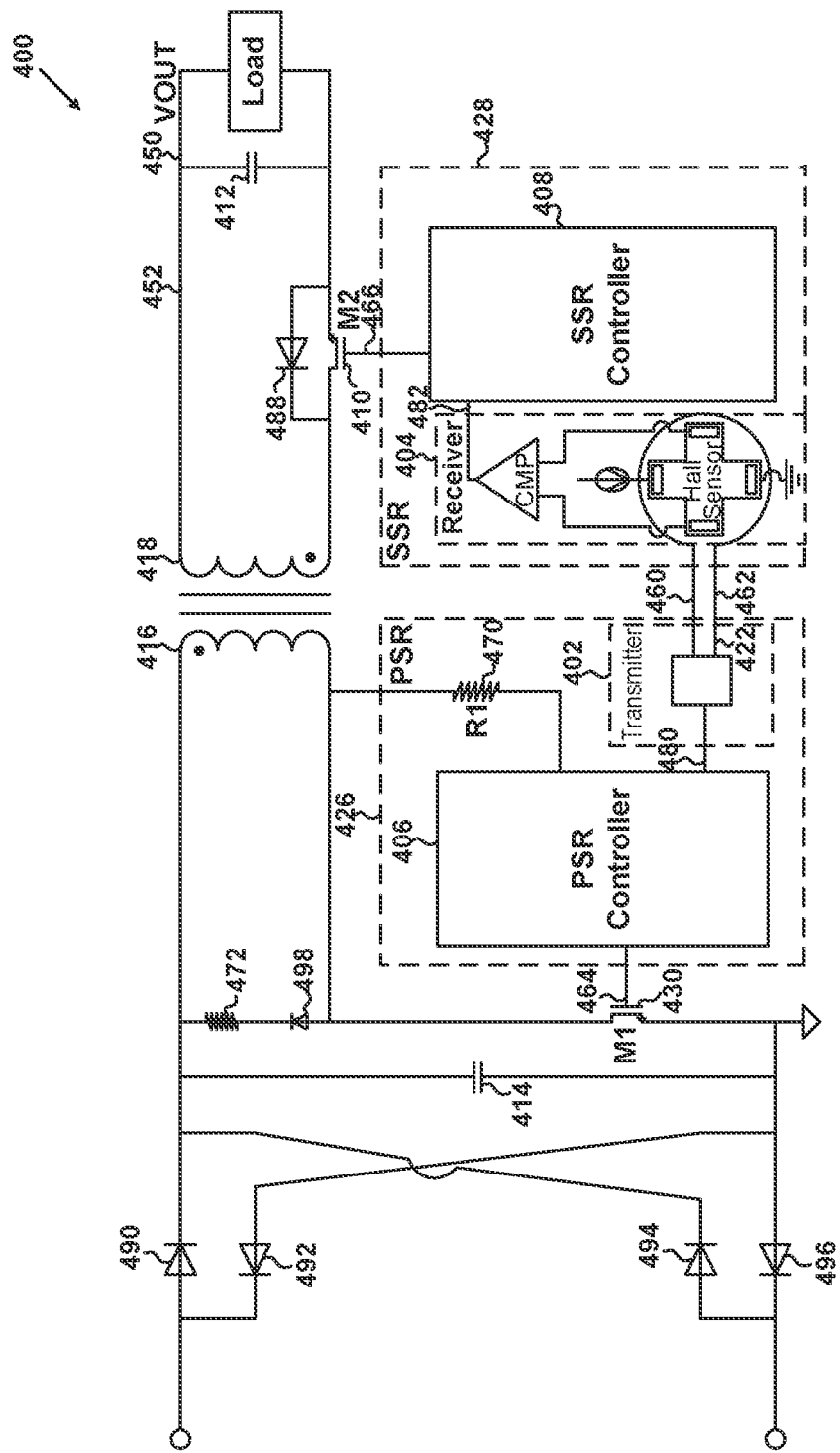
FIG. 4 is a simplified diagram showing a power converter according to an embodiment of the present invention.

FIG. 4 is a simplified diagram showing a power converter according to an embodiment of the present invention. This diagram is merely an example, which should not unduly limit the scope of the claims. One of ordinary skill in the art would recognize many variations, alternatives, and modifications. The power converter 400 (e.g., a switch-mode power converter) includes a transistor 410, capacitors 412 and 414, a primary controller system 426, a secondary controller system 428, a primary winding 416, a secondary winding 418, a power switch 430, wires 460 and 462, a resistor 472, diodes 488, 490, 492, 494, 496 and 498. For example, the transistor 410 is a MOSFET. As an example, the power switch 430 is a transistor.

In some examples, the primary controller system 426 includes a transmitter 402, a primary-side-regulation (PSR) controller 406, and a resistor 470, and the secondary controller system 428 includes a secondary-side-regulation (SSR) controller 408 and a receiver 404. For example, the transmitter 402 and the receiver 404 are connected to each other by the wires 460 and 462. In certain examples, the primary controller system 426 is located on a chip, and the secondary controller system 428 is located on another chip. For example, the chip for the primary controller system 426 and the chip for the secondary controller system 428 are connected to each other by the wires 460 and 462.

In some embodiments, the primary controller system 426 generates a control signal 464, which is used to open (e.g., turn off) or close (e.g., turn on) the power switch 430 to affect a primary current that flows through the primary winding 416 of the power converter 400. For example, when the power switch 430 is closed (e.g., turned on), the energy is stored in a transformer that includes the primary winding 416 and the secondary winding 418. As an example, when the power switch 430 is open (e.g., turned off), the stored energy is transferred to the secondary side.

In certain embodiments, the secondary controller system 428 generates a control signal 466, which is used to turn off or turn on the transistor 410 to affect a secondary current 452 that flows through the secondary winding 418 of the power converter 400. For example, the power switch 430 remains open (e.g., turned off) when the transistor 410 is turned on. As an example, during the process of energy transfer (e.g., during a demagnetization process), the transistor 410 is turned on and at least a part of the secondary current 452 flows through the transistor 410. As an example, at the end of the energy transfer process (e.g., at the end of the demagnetization process), the secondary current 452 has a low value (e.g., nearly zero) and the transistor 410 is turned off.

As shown in FIG. 4, the primary controller system 426 generates the control signal 464 and a current 422, sends the control signal 464 to the power switch 430, and sends the current 422 to the secondary controller system 428, and the secondary controller system 428 receives the current 422, generates the control signal 466 in response to the current 422, and sends the control signal 466 to the transistor 410, according to certain embodiments.

In some examples, the primary controller system 426 includes the transmitter 402, the primary-side-regulation (PSR) controller 406, and the resistor 470. For examples, the primary-side-regulation (PSR) controller 406 generates the control signal 464 and the input signal 480, sends the control signal 464 to the power switch 430, and sends the input signal 480 to the transmitter 402. As an example, the transmitter 402 receives the input signal 480, generates the current 422 in response to the input signal 480, and transmits the current 422 to the receiver 404 of the secondary controller system 428.

In certain examples, the secondary controller system 428 includes the secondary-side-regulation (SSR) controller 408 and the receiver 404. For example, the receiver 404 receives the current 422, generates an output voltage 482 in response to the current 422, and outputs the output voltage 482. As an example, the secondary-side-regulation (SSR) controller 408 receives the output voltage 482, generates the control signal 466 in response to the output voltage 482, and sends the control signal 466 to the transistor 410.

According to some embodiments, the transmitter 402 is the same as the transmitter 302, the receiver 404 is the same as the receiver 304, the wire 460 is the same as the wire 360, the wire 462 is the same as the wire 362, the input signal 480 is the same as the input signal 380, the current 422 is the same as the current 322, and the output voltage 482 is the same as the output voltage 382.

As discussed above and further emphasized here, FIG. 4 is merely an example, which should not unduly limit the scope of the claims. One of ordinary skill in the art would recognize many variations, alternatives, and modifications. For example, the primary controller system 426 and the secondary controller system 428 are integrated on a same chip.

Figure 5:
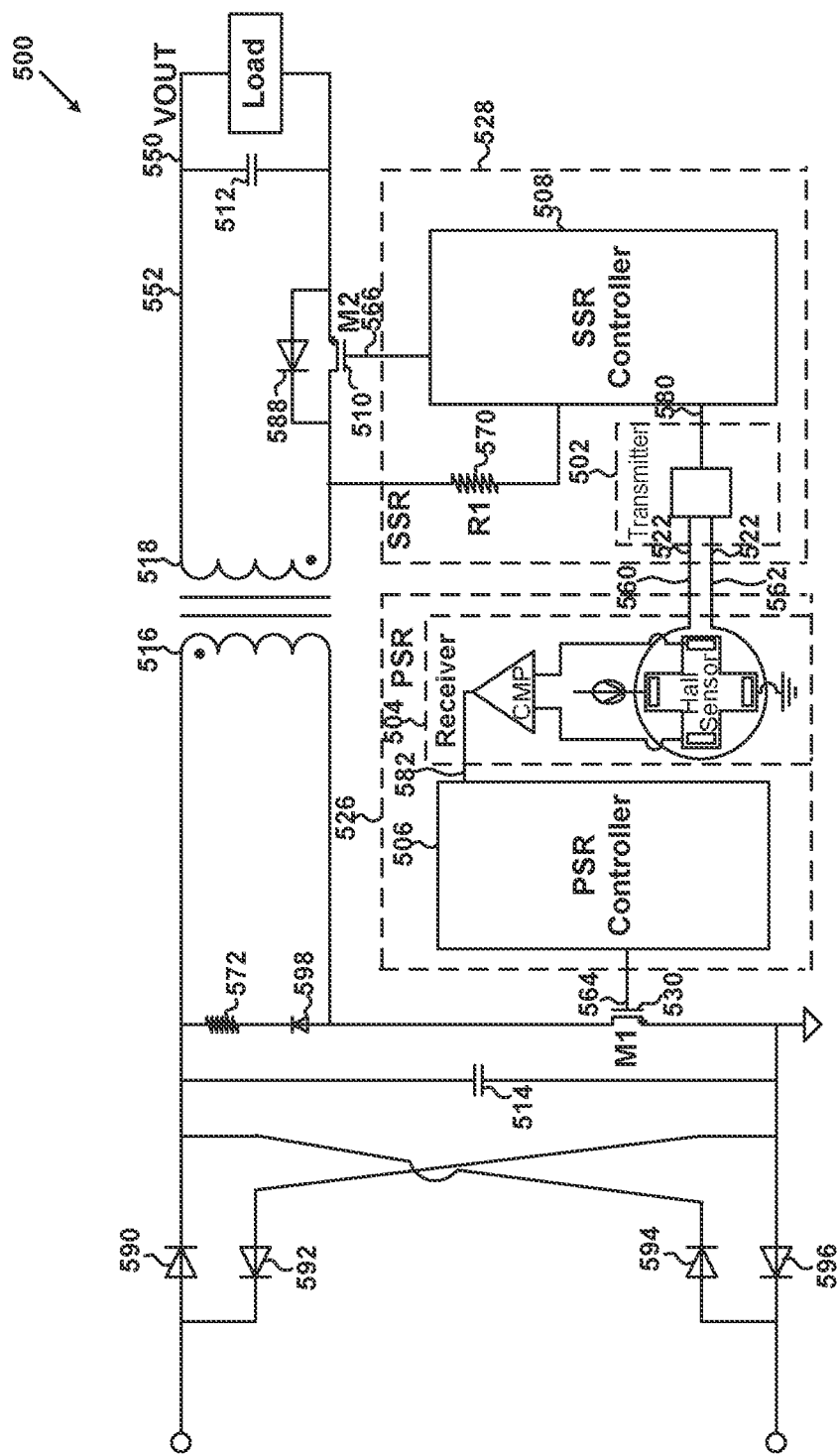
FIG. 5 is a simplified diagram showing a power converter according to another embodiment of the present invention.

FIG. 5 is a simplified diagram showing a power converter according to another embodiment of the present invention. This diagram is merely an example, which should not unduly limit the scope of the claims. One of ordinary skill in the art would recognize many variations, alternatives, and modifications. The power converter 500 (e.g., a switch-mode power converter) includes a transistor 510, capacitors 512 and 514, a primary controller system 526, a secondary controller system 528, a primary winding 516, a secondary winding 518, a power switch 530, wires 560 and 562, a resistor 572, diodes 588, 590, 592, 594, 596 and 598. For example, the transistor 510 is a MOSFET. As an example, the power switch 530 is a transistor.

In some examples, the primary controller system 526 includes a receiver 504 and a primary-side-regulation (PSR) controller 506, and the secondary controller system 528 includes a transmitter 502, a secondary-side-regulation (SSR) controller 508 and a resistor 570. For example, the transmitter 502 and the receiver 504 are connected to each other by the wires 560 and 562. In certain examples, the primary controller system 526 is located on a chip, and the secondary controller system 528 is located on another chip. For example, the chip for the primary controller system 526 and the chip for the secondary controller system 528 are connected to each other by the wires 560 and 562.

In some embodiments, the primary controller system 526 generates a control signal 564, which is used to open (e.g., turn off) or close (e.g., turn on) the power switch 530 to affect a primary current that flows through the primary winding 516 of the power converter 500. For example, when the power switch 530 is closed (e.g., turned on), the energy is stored in a transformer that includes the primary winding 516 and the secondary winding 518. As an example, when the power switch 530 is open (e.g., turned off), the stored energy is transferred to the secondary side.

In certain embodiments, the secondary controller system 528 generates a control signal 566, which is used to turn off or turn on the transistor 510 to affect a secondary current 552 that flows through the secondary winding 518 of the power converter 500. For example, the power switch 530 remains open (e.g., turned off) when the transistor 510 is turned on. As an example, during the process of energy transfer (e.g., during a demagnetization process), the transistor 510 is turned on and at least a part of the secondary current 552 flows through the transistor 510. As an example, at the end of the energy transfer process (e.g., at the end of the demagnetization process), the secondary current 552 has a low value (e.g., nearly zero) and the transistor 510 is turned off.

As shown in FIG. 5, the secondary controller system 528 generates the control signal 566 and a current 522, sends the control signal 566 to the transistor 510, and sends the current 522 to the primary controller system 526, and the primary controller system 526 receives the current 522, generates the control signal 564 in response to the current 522, and sends the control signal 564 to the power switch 530, according to certain embodiments.

In some examples, the secondary controller system 528 includes the transmitter 502, the secondary-side-regulation (SSR) controller 508, and the resistor 570. For examples, the secondary-side-regulation (SSR) controller 508 generates the control signal 566 and the input signal 580, sends the control signal 566 to the transistor 510, and sends the input signal 580 to the transmitter 502. As an example, the transmitter 502 receives the input signal 580, generates the current 522 in response to the input signal 580, and transmits the current 522 to the receiver 504 of the primary controller system 526.

In certain examples, the primary controller system 526 includes the primary-side-regulation (PSR) controller 506 and the receiver 504. For example, the receiver 504 receives the current 522, generates an output voltage 582 in response to the current 422, and outputs the output voltage 582. As an example, the primary-side-regulation (PSR) controller 506 receives the output voltage 582, generates the control signal 564 in response to the output voltage 582, and sends the control signal 564 to the power switch 530.

According to some embodiments, the transmitter 502 is the same as the transmitter 302, the receiver 504 is the same as the receiver 304, the wire 560 is the same as the wire 360, the wire 562 is the same as the wire 362, the input signal 580 is the same as the input signal 380, the current 522 is the same as the current 322, the output voltage 582 is the same as the output voltage 382.

As discussed above and further emphasized here, FIG. 5 is merely an example, which should not unduly limit the scope of the claims. One of ordinary skill in the art would recognize many variations, alternatives, and modifications. For example, the primary controller system 526 and the secondary controller system 528 are integrated on a same chip.

Figure 6:
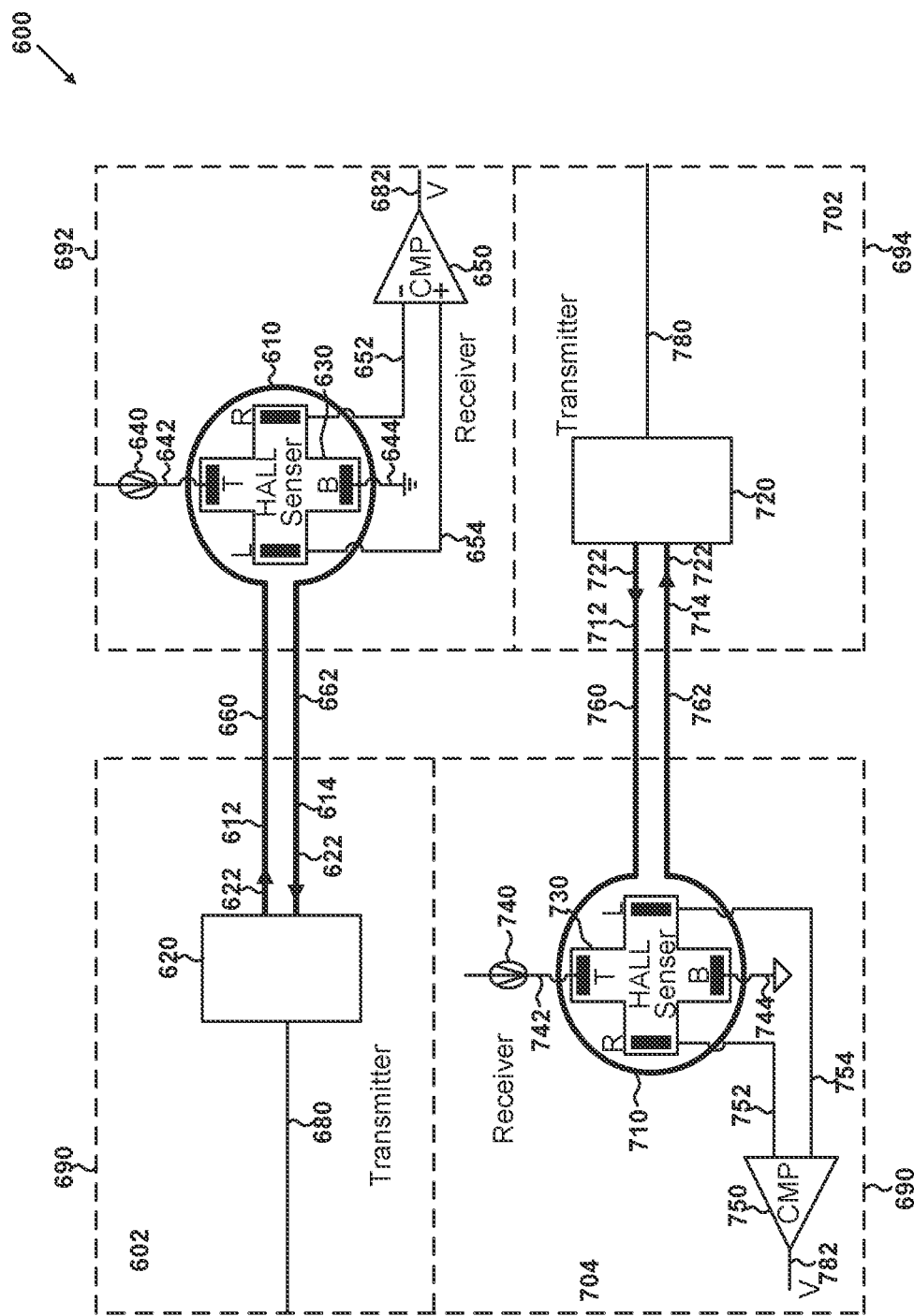
FIG. 6 is a simplified diagram showing a transmitting and receiving system including one or more Hall effect sensors according to another embodiment of the present invention.

FIG. 6 is a simplified diagram showing a transmitting and receiving system including one or more Hall effect sensors according to another embodiment of the present invention. This diagram is merely an example, which should not unduly limit the scope of the claims. One of ordinary skill in the art would recognize many variations, alternatives, and modifications. The transmitting and receiving system 600 includes transmitters 602 and 702, receivers 604 and 704, and wires 660, 662, 760 and 762.

In some examples, the transmitter 602 includes wires 612 and 614 and a current source 620. In certain examples, the receiver 604 includes a coil 610, a Hall effect sensor 630, a current source 640, wires 642 and 644, a comparator 650, and wires 652 and 654. For example, the transmitter 602 and the receiver 604 are connected to each other by the wires 660 and 662.

In some examples, the transmitter 702 includes wires 712 and 714 and a current source 720. In certain examples, the receiver 704 includes a coil 710, a Hall effect sensor 730, a current source 740, wires 742 and 744, a comparator 750, and wires 752 and 754. For example, the transmitter 702 and the receiver 704 are connected to each other by the wires 760 and 762.

According to certain embodiments, the transmitter 602 and the receiver 704 are located on a chip 690, and the receiver 604 and the transmitter 702 are located on a chip 692. For example, the chip 690 for the transmitter 602 and the receiver 704 and the chip 692 for the receiver 604 and the transmitter 702 are connected to each other by the wires 660, 662, 760 and 762.

According to some embodiments, the coil 610 is used to generate a magnetic field, and the Hall effect sensor 630 is used to sense the magnetic field generated by the coil 610, and the coil 710 is used to generate a magnetic field, and the Hall effect sensor 730 is used to sense the magnetic field generated by the coil 710. According to certain embodiments, the coil 610 is electrically isolated (e.g., by one or more dielectric layers) from the Hall effect sensor 630 and the wires 642, 644, 652, and 654, and the coil 710 is electrically isolated (e.g., by one or more dielectric layers) from the Hall effect sensor 730 and the wires 742, 744, 752, and 754.

As shown in FIG. 6, the current source 620 receives an input signal 680 and generates a current 622 in response to the input signal 680, and the current 622 flows from the wire 612 to the wire 614 through the wire 660, the coil 610, and the wire 662 and generates the magnetic field (e.g., the magnetic field perpendicular to the Hall effect sensor 630), according to some embodiments. As an example, the magnetic field generated by the current 622 flowing through the coil 610 penetrates through the Hall effect sensor 630, and the Hall effect sensor 630 is located within the magnetic field.

According to certain embodiments, the current source 640 provides a current flowing from the wire 642 to the wire 644 through the Hall effect sensor 630. For example, the wire 644 is biased to a secondary-side ground voltage. As an example, within the Hall effect sensor 630, the current flowing from a first electrode to a second electrode of the Hall effect sensor 630 generates a voltage between a third electrode and a fourth electrode of the Hall effect sensor 630 under the magnetic field. For example, the generated voltage depends on the magnetic field generated by the current 622 flowing through the coil 610.

According to some embodiments, an input terminal (e.g., a negative electrode) of the comparator 650 receives the voltage level of the third electrode of the Hall effect sensor 630 through the wire 652, and another input terminal (e.g., a positive electrode) of the comparator 650 receives the voltage level of the fourth electrode of the Hall effect sensor 630 through the wire 654. In certain examples, the comparator 650 generates an output voltage 682 at an output terminal of the comparator 650, in response to the voltage levels received at the two input terminals of the comparator 650.

As shown in FIG. 6, the current source 720 receives an input signal 780 and generates a current 722 in response to the input signal 780, and the current 722 flows from the wire 712 to the wire 714 through the wire 760, the coil 710, and the wire 762 and generates the magnetic field (e.g., the magnetic field perpendicular to the Hall effect sensor 730), according to some embodiments. As an example, the magnetic field generated by the current 722 flowing through the coil 710 penetrates through the Hall effect sensor 730, and the Hall effect sensor 730 is located within the magnetic field.

According to certain embodiments, the current source 740 provides a current flowing from the wire 742 to the wire 744 through the Hall effect sensor 730. For example, the wire 744 is biased to a primary-side ground voltage. As an example, within the Hall effect sensor 730, the current flowing from a first electrode to a second electrode of the Hall effect sensor 730 generates a voltage between a third electrode and a fourth electrode of the Hall effect sensor 730 under the magnetic field. For example, the generated voltage depends on the magnetic field generated by the current 722 flowing through the coil 710.

According to some embodiments, an input terminal (e.g., a negative electrode) of the comparator 750 receives the voltage level of the third electrode of the Hall effect sensor 730 through the wire 752, and another input terminal (e.g., a positive electrode) of the comparator 750 receives the voltage level of the fourth electrode of the Hall effect sensor 730 through the wire 754. In certain examples, the comparator 750 generates an output voltage 782 at an output terminal of the comparator 750, in response to the voltage levels received at the two input terminals of the comparator 750.

In some embodiments, the transmitter 602 receives the input signal 680, generates the current 622 in response to the input signal 680, and transmits the current 622 to the receiver 604, and the receiver 604 receives the current 622, generates the output voltage 682 in response to the current 622, and outputs the output voltage 682. In certain embodiments, the transmitter 702 receives the input signal 780, generates the current 722 in response to the input signal 780, and transmits the current 722 to the receiver 704, and the receiver 704 receives the current 722, generates the output voltage 782 in response to the current 722, and outputs the output voltage 782.

In some examples, the chip 690 for the transmitter 602 and the receiver 704 sends the current 622 to the chip 692 for the receiver 604 and the transmitter 702, which receives the current 622 and generates the output voltage 682 that has the same logic level as the current 622. In certain examples, the chip 692 for the receiver 604 and the transmitter 702 sends the current 722 to the chip 690 for the transmitter 602 and the receiver 704, which receives the current 722 and generates the output voltage 782 that has the same logic level as the current 722.

According to certain embodiments, if the current 622 includes one or more pulses, the output voltage 682 also includes one or more corresponding pulses, achieving communications from the transmitter 602 to the receiver 604, and if the current 722 includes one or more pulses, the output voltage 782 also includes one or more corresponding pulses, achieving communications from the transmitter 702 to the receiver 704. For example, there are communications from the chip 690 for the transmitter 602 and the receiver 704 to the chip 692 for the receiver 604 and the transmitter 702, and there are communications from the chip 692 for the receiver 604 and the transmitter 702 to the chip 690 for the transmitter 602 and the receiver 704, achieving bidirectional communications between the chips 690 and 692.

According to certain embodiments, the transmitter 602 is the same as the transmitter 302, the receiver 604 is the same as the receiver 304, the transmitter 702 is the same as the transmitter 302, the receiver 704 is the same as the receiver 304, the wire 660 is the same as the wire 360, the wire 662 is the same as the wire 362, the wire 760 is the same as the wire 360, and the wire 762 is the same as the wire 362.

For example, the wire 612 is the same as the wire 312, the wire 614 is the same as the wire 314, the current source 620 is the same as the current source 320, the coil 610 is the same as the coil 310, the Hall effect sensor 630 is the same as the Hall effect sensor 330, the current source 640 is the same as the current source 340, the wire 642 is the same as the wire 342, the wire 644 is the same as the wire 344 (e.g., biased to a primary-side ground voltage), the comparator 650 is the same as the comparator 350, the wire 652 is the same as the wire 352, and the wire 654 is the same as the wire 354. As an example, the wire 712 is the same as the wire 312, the wire 714 is the same as the wire 314, the current source 720 is the same as the current source 320, the coil 710 is the same as the coil 310, the Hall effect sensor 730 is the same as the Hall effect sensor 330, the current source 740 is the same as the current source 340, the wire 742 is the same as the wire 342, the wire 744 is the same as the wire 344 (e.g., biased to a secondary-side ground voltage), the comparator 750 is the same as the comparator 350, the wire 752 is the same as the wire 352, and the wire 754 is the same as the wire 354.

As discussed above and further emphasized here, FIG. 6 is merely an example, which should not unduly limit the scope of the claims. One of ordinary skill in the art would recognize many variations, alternatives, and modifications. For example, the transmitters 602 and 702 and the receivers 604 and 704 are located on a same chip. As an example, within the same chip, the transmitter 602 and the receiver 604 are connected to each other by the wires 660 and 662, and the receiver 704 and the transmitter 702 are connected to each other by the wires 760 and 762.

Figure 7:
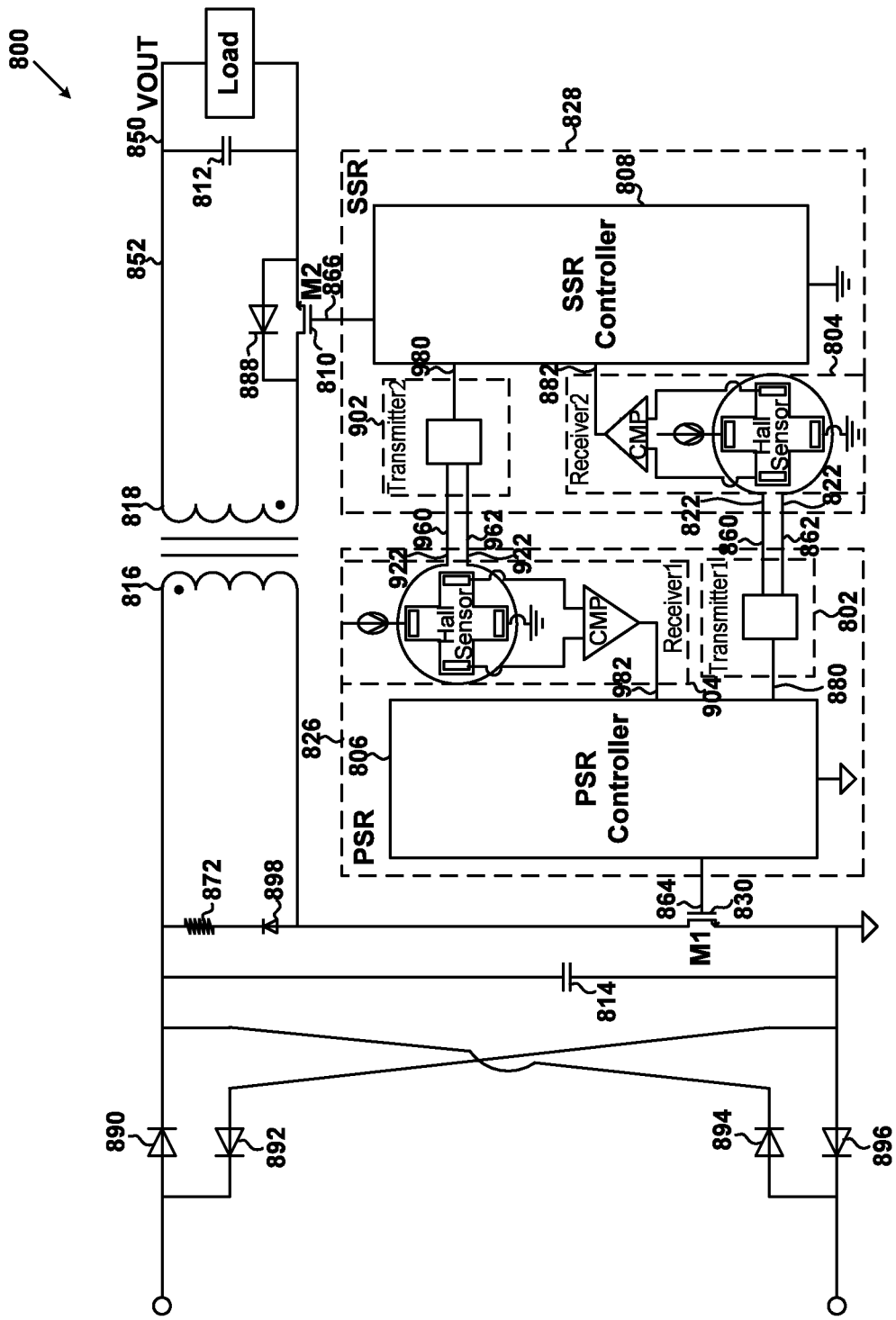
FIG. 7 is a simplified diagram showing a power converter according to another embodiment of the present invention.

FIG. 7 is a simplified diagram showing a power converter according to another embodiment of the present invention. This diagram is merely an example, which should not unduly limit the scope of the claims. One of ordinary skill in the art would recognize many variations, alternatives, and modifications. The power converter 800 (e.g., a switch-mode power converter) includes a transistor 810, capacitors 812 and 814, a primary controller system 826, a secondary controller system 828, a primary winding 816, a secondary winding 818, a power switch 830, wires 860, 862, 960 and 962, a resistor 872, diodes 888, 890, 892, 894, 896 and 898. For example, the transistor 810 is a MOSFET. As an example, the power switch 830 is a transistor.

In some examples, the primary controller system 826 includes a transmitter 802, a primary-side-regulation (PSR) controller 806, and a receiver 904, and the secondary controller system 828 includes a receiver 804, a secondary-side-regulation (SSR) controller 808, and a transmitter 902. For example, the transmitter 802 and the receiver 804 are connected to each other by the wires 860 and 862, and the receiver 904 and the transmitter 902 are connected to each other by the wires 960 and 962. In certain examples, the primary controller system 826 is located on a chip, and the secondary controller system 828 is located on another chip. For example, the chip for the primary controller system 826 and the chip for the secondary controller system 828 are connected to each other by the wires 860, 862, 960 and 962.

In some embodiments, the primary controller system 826 generates a control signal 864, which is used to open (e.g., turn off) or close (e.g., turn on) the power switch 830 to affect a primary current that flows through the primary winding 816 of the power converter 800. For example, when the power switch 830 is closed (e.g., turned on), the energy is stored in a transformer that includes the primary winding 816 and the secondary winding 818. As an example, when the power switch 830 is open (e.g., turned off), the stored energy is transferred to the secondary side.

In certain embodiments, the secondary controller system 828 generates a control signal 866, which is used to turn off or turn on the transistor 810 to affect a secondary current 852 that flows through the secondary winding 818 of the power converter 800. For example, the power switch 830 remains open (e.g., turned off) when the transistor 810 is turned on. As an example, during the process of energy transfer (e.g., during a demagnetization process), the transistor 810 is turned on and at least a part of the secondary current 852 flows through the transistor 810. As an example, at the end of the energy transfer process (e.g., at the end of the demagnetization process), the secondary current 852 has a low value (e.g., nearly zero) and the transistor 810 is turned off.

According to certain embodiments, the primary controller system 826 generates a current 822 and sends the current 822 to the secondary controller system 828, and the secondary controller system 828 receives the current 822, generates the control signal 866 in response to the current 822, and sends the control signal 866 to the transistor 810. According to some embodiments, the secondary controller system 828 generates a current 922 and sends the current 922 to the primary controller system 826, and the primary controller system 826 receives the current 922, generates the control signal 864 in response to the current 922, and sends the control signal 864 to the power switch 830.

In some examples, the primary controller system 826 includes the transmitter 802, the primary-side-regulation (PSR) controller 806, and the receiver 904, and the secondary controller system 828 includes the receiver 804, the secondary-side-regulation (SSR) controller 808, and the transmitter 902. For example, the primary-side-regulation (PSR) controller 806 generates the input signal 880 and sends the input signal 880 to the transmitter 802, and the transmitter 802 receives the input signal 880, generates the current 822 in response to the input signal 880, and transmits the current 822 to the receiver 804 of the secondary controller system 828. As an example, the receiver 804 receives the current 822, generates an output voltage 882 in response to the current 822, and outputs the output voltage 882, and the secondary-side-regulation (SSR) controller 808 receives the output voltage 882, generates the control signal 866 in response to the output voltage 882, and sends the control signal 866 to the transistor 810.

For example, the secondary-side-regulation (SSR) controller 808 generates the input signal 980 and sends the input signal 980 to the transmitter 902, and the transmitter 902 receives the input signal 980, generates the current 922 in response to the input signal 980, and transmits the current 922 to the receiver 904 of the primary controller system 826. As an example, the receiver 904 receives the current 922, generates an output voltage 982 in response to the current 922, and outputs the output voltage 982, and the primary-side-regulation (PSR) controller 806 receives the output voltage 982, generates the control signal 864 in response to the output voltage 982, and sends the control signal 864 to the power switch 830.

According to some embodiments, the transmitter 802 is the same as the transmitter 602, the receiver 804 is the same as the receiver 604, the wire 860 is the same as the wire 660, the wire 862 is the same as the wire 662, the input signal 880 is the same as the input signal 680, the current 822 is the same as the current 622, and the output voltage 882 is the same as the output voltage 682. According to certain embodiments, the transmitter 902 is the same as the transmitter 702, the receiver 904 is the same as the receiver 704, the wire 960 is the same as the wire 760, the wire 962 is the same as the wire 762, the input signal 980 is the same as the input signal 780, the current 922 is the same as the current 722, and the output voltage 982 is the same as the output voltage 782.

In some embodiments, the transmitter 1002 is the same as the transmitter 802, the receiver 1004 is the same as the receiver 804, the wire 1060 is the same as the wire 860, the wire 1062 is the same as the wire 862, the input signal 1080 is the same as the input signal 880, the current 1022 is the same as the current 822, and the output voltage 1082 is the same as the output voltage 882. In certain embodiments, the transmitter 1102 is the same as the transmitter 902, the receiver 1104 is the same as the receiver 904, the wire 1160 is the same as the wire 960, the wire 1162 is the same as the wire 962, the input signal 1180 is the same as the input signal 980, the current 1122 is the same as the current 922, and the output voltage 1182 is the same as the output voltage 982.

As discussed above and further emphasized here, FIG. 7 is merely an example, which should not unduly limit the scope of the claims. One of ordinary skill in the art would recognize many variations, alternatives, and modifications. For example, the primary controller system 826 and the secondary controller system 828 are integrated on a same chip as shown in FIG. 8, in order to, for example, simplify chip peripheral design and improve system reliability.

Figure 8:
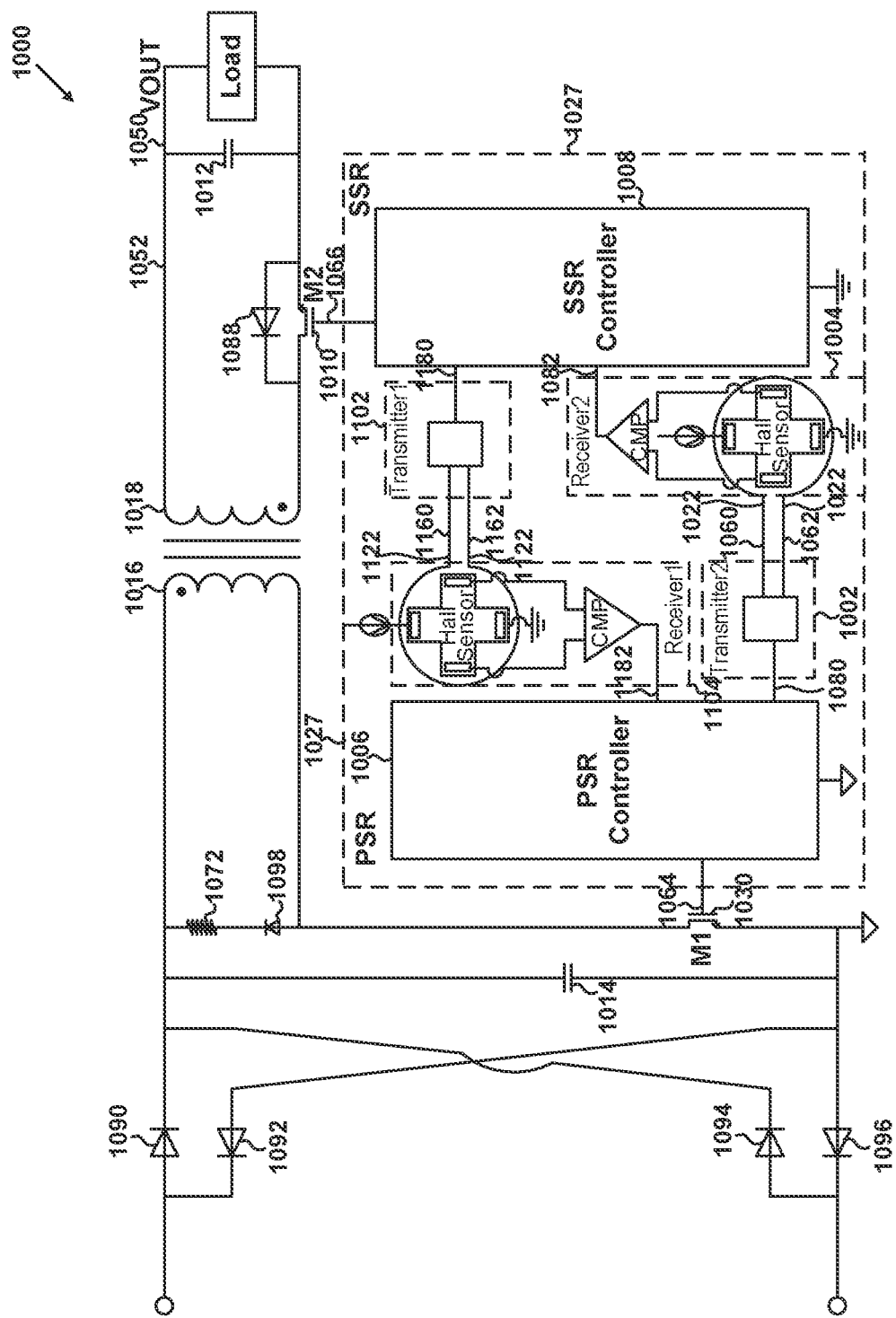
FIG. 8 is a simplified diagram showing a power converter according to yet another embodiment of the present invention.

FIG. 8 is a simplified diagram showing a power converter according to yet another embodiment of the present invention. This diagram is merely an example, which should not unduly limit the scope of the claims. One of ordinary skill in the art would recognize many variations, alternatives, and modifications. The power converter 1000 (e.g., a switch-mode power converter) includes a transistor 1010, capacitors 1012 and 1014, a controller system 1027, a primary winding 1016, a secondary winding 1018, a power switch 1030, wires 1060, 1062, 1160 and 1162, a resistor 1072, diodes 1088, 1090, 1092, 1094, 1096 and 1098. For example, the transistor 1010 is a MOSFET. As an example, the power switch 1030 is a transistor.

In some examples, the controller system 1027 includes transmitters 1002 and 1102, receivers 1004 and 1104, a primary-side-regulation (PSR) controller 1006, and a secondary-side-regulation (SSR) controller 1008. For example, the transmitter 1002 and the receiver 1004 are connected to each other by the wires 1060 and 1062, and the receiver 1104 and the transmitter 1102 are connected to each other by the wires 1160 and 1162. In certain examples, the controller system 1027 is located on a chip.

In some embodiments, the controller system 1027 generates a control signal 1064, which is used to open (e.g., turn off) or close (e.g., turn on) the power switch 1030 to affect a primary current that flows through the primary winding 1016 of the power converter 1000. As an example, the controller system 1027 also generates a control signal 1066, which is used to turn off or turn on the transistor 1010 to affect a secondary current 1052 that flows through the secondary winding 1018 of the power converter 1000. For example, when the power switch 1030 is closed (e.g., turned on), the energy is stored in a transformer that includes the primary winding 1016 and the secondary winding 1018. As an example, when the power switch 1030 is open (e.g., turned off), the stored energy is transferred to the secondary side.

For example, the power switch 1030 remains open (e.g., turned off) when the transistor 1010 is turned on. As an example, during the process of energy transfer (e.g., during a demagnetization process), the transistor 1010 is turned on and at least a part of the secondary current 1052 flows through the transistor 1010. As an example, at the end of the energy transfer process (e.g., at the end of the demagnetization process), the secondary current 1052 has a low value (e.g., nearly zero) and the transistor 1010 is turned off.

In some examples, the primary-side-regulation (PSR) controller 1006 generates an input signal 1080 and sends the input signal 1080 to the transmitter 1002, and the transmitter 1002 receives the input signal 1080, generates the current 1022 in response to the input signal 1080, and transmits the current 1022 to the receiver 1004. In certain examples, the receiver 1004 receives the current 1022, generates an output voltage 1082 in response to the current 1022, and outputs the output voltage 1082, and the secondary-side-regulation (SSR) controller 1008 receives the output voltage 1082, generates the control signal 1066 in response to the output voltage 1082, and sends the control signal 1066 to the transistor 1010.

In some examples, the secondary-side-regulation (SSR) controller 1008 generates the input signal 1180 and sends the input signal 1180 to the transmitter 1102, and the transmitter 1102 receives the input signal 1180, generates the current 1122 in response to the input signal 1180, and transmits the current 1122 to the receiver 1104. In certain examples, the receiver 1104 receives the current 1122, generates an output voltage 1182 in response to the current 1122, and outputs the output voltage 1182, and the primary-side-regulation (PSR) controller 1006 receives the output voltage 1182, generates the control signal 1064 in response to the output voltage 1182, and sends the control signal 1064 to the power switch 1030.

According to some embodiments, the transmitter 1002 is the same as the transmitter 602, the receiver 1004 is the same as the receiver 604, the wire 1060 is the same as the wire 660, the wire 1062 is the same as the wire 662, the input signal 1080 is the same as the input signal 680, the current 1022 is the same as the current 622, and the output voltage 1082 is the same as the output voltage 682.

According to certain embodiments, the transmitter 1102 is the same as the transmitter 702, the receiver 1104 is the same as the receiver 704, the wire 1160 is the same as the wire 760, the wire 1162 is the same as the wire 762, the input signal 1180 is the same as the input signal 780, the current 1122 is the same as the current 722, and the output voltage 1182 is the same as the output voltage 782.

Some embodiments of the present invention provide systems and methods using one or more Hall effect sensors to achieve isolation communications between a primary-side controller (e.g., the controller 406, the controller 506, the controller 806, the controller 1006) and a secondary-side controller (e.g., the controller 408, the controller 508, the controller 808, the controller 1008). For example, the primary-side controller and the secondary-side controller can be easily integrated. As an example, the system cost is lowered, and the system reliability is improved.

According to certain embodiments, a system for transmitting and receiving (e.g., the system 300) includes a transmitter (e.g., the transmitter 302), one or more wires (e.g., the wire 360 and/or the wire 362), and a receiver (e.g., the receiver 304) connected to the transmitter through the one or more wires. The transmitter is configured to generate a first current (e.g., the current 322), and the receiver is configured to receive the first current. The receiver includes a coil (e.g., the coil 310), a Hall effect sensor (e.g., the Hall effect sensor 330), and a comparator (e.g., the comparator 350), and the Hall effect sensor includes a first electrode (e.g., the electrode 334) and a second electrode (e.g., the electrode 338). The coil is electrically isolated from the Hall effect sensor and configured to generate a magnetic field based at least in part on the first current flowing through the coil, and the Hall effect sensor is configured to sense the magnetic field and generate a first voltage at the first electrode and a second voltage at the second electrode. The comparator includes a first input terminal (e.g., the input terminal 370) and a second input terminal (e.g., the input terminal 372). The comparator is configured to receive the first voltage at the first input terminal, receive the second voltage at the second input terminal, and generate an output voltage (e.g., the output voltage 382) based at least in part on the first voltage and the second voltage. For example, the system 300 is implemented according to at least FIG. 3A.

In some examples, the receiver is further configured to: in response to the first current increasing from a first current magnitude (e.g., $I_A$) to a second current magnitude (e.g., $I_B$), increase the output voltage from a first voltage magnitude (e.g., $V_A$) to a second voltage magnitude (e.g., $V_B$); and in response to the first current decreasing from the second current magnitude to the first current magnitude, decrease the output voltage from the second voltage magnitude to the first voltage magnitude. In certain examples, the Hall effect sensor further includes a third electrode (e.g., the electrode 332) and a fourth electrode (e.g., the electrode 336); and the receiver further includes a current source (e.g., the current source 340) configured to generate a second current (e.g., the current 346) flowing from the third electrode to the fourth electrode.

In some examples, the transmitter is further configured to receive an input signal (e.g., the input signal 380) and generate the first current (e.g., the current 322) in response to the input signal. In certain examples, the transmitter includes a current source (e.g., the current source 320) configured to receive the input signal and generate the first current in response to the input signal.

According to some embodiments, a system for a power converter (e.g., the power converter 400) includes a first controller system (e.g., the primary controller system 426) including a first controller (e.g., the primary-side-regulation controller 406) and a transmitter (e.g., the transmitter 402), one or more wires (e.g., the wire 460 and/or the wire 462), and a second controller system (e.g., the secondary controller system 428) connected to the first controller system through the one or more wires. The second controller system includes a second controller (e.g., the secondary-side-regulation controller 408) and a receiver (e.g., the receiver 404). The first controller is configured to output a first control signal (e.g., the control signal 464) to a first switch (e.g., the power switch 430) to affect a first current flowing through a primary winding of a power converter, and generate an input signal (e.g., the input signal 480). The transmitter is configured to receive the input signal and generate a current (e.g., the current 422) in response to the input signal. The receiver includes a coil (e.g., the coil 310) configured to generate a magnetic field based at least in part on the current flowing through the coil, a Hall effect sensor (e.g., the Hall effect sensor 330) configured to sense the magnetic field, and a comparator (e.g., the comparator 350) configured to receive a first sensor voltage and a second sensor voltage from the Hall effect sensor. The receiver is configured to receive the current and generate an output signal (e.g., the output voltage 482) based at least in part on the current. The second controller is configured to receive the output signal, and output a second control signal (e.g., the control signal 466) to a second switch (e.g., the transistor 410) to affect a second current flowing through a secondary winding of the power converter. The secondary winding is coupled to the primary winding. For example, the system is implemented according to at least FIG. 4.

In certain examples, the Hall effect sensor includes a first electrode (e.g., the electrode 334) and a second electrode (e.g., the electrode 338), and the comparator includes a first input terminal (e.g., the input terminal 370) and a second input terminal (e.g., the input terminal 372). In some examples, the Hall effect sensor is configured to generate the first sensor voltage at the first electrode and the second sensor voltage at the second electrode. In certain examples, the comparator is configured to receive the first sensor voltage at the first input terminal, receive the second sensor voltage at the second input terminal, and generate the output signal based at least in part on the first sensor voltage and the second sensor voltage.

According to certain embodiments, a system for a power converter (e.g., the power converter 500) includes a first controller system (e.g., the primary controller system 526) including a first controller (e.g., the primary-side-regulation controller 506) and a receiver (e.g., the receiver 504), one or more wires (e.g., the wire 560 and/or the wire 562), and a second controller system (e.g., the secondary controller system 528) connected to the first controller system through the one or more wires, the second controller system including a second controller (e.g., the secondary-side-regulation controller 508) and a transmitter (e.g., the transmitter 502). The second controller is configured to output a first control signal (e.g., the control signal 566) to a first switch (e.g., the transistor 510) to affect a first current flowing through a secondary winding of a power converter, and generate an input signal (e.g., the input signal 580). The transmitter is configured to receive the input signal and generate a current (e.g., the current 522) in response to the input signal. The receiver includes a coil (e.g., the coil 310) configured to generate a magnetic field based at least in part on the current flowing through the coil, a Hall effect sensor (e.g., the Hall effect sensor 330) configured to sense the magnetic field, and a comparator (e.g., the comparator 350) configured to receive a first sensor voltage and a second sensor voltage from the Hall effect sensor. The receiver is configured to receive the current and generate an output signal (e.g., the output voltage 582) based at least in part on the current. The first controller is configured to: receive the output signal, and output a second control signal (e.g., the control signal 564) to a second switch (e.g., the power switch 530) to affect a second current flowing through a primary winding of the power converter. The primary winding is coupled to the secondary winding. For example, the system is implemented according to at least FIG. 5.

In some examples, the Hall effect sensor includes a first electrode (e.g., the electrode 334) and a second electrode (e.g., the electrode 338), and the comparator includes a first input terminal (e.g., the input terminal 370) and a second input terminal (e.g., the input terminal 372). In certain examples, the Hall effect sensor is configured to generate the first sensor voltage at the first electrode and the second sensor voltage at the second electrode. In some examples, the comparator is configured to receive the first sensor voltage at the first input terminal, receive the second sensor voltage at the second input terminal, and generate the output signal based at least in part on the first sensor voltage and the second sensor voltage.

According to some embodiments, a system for a power converter (e.g., the power converter 800 and/or the power converter 1000) includes a first controller (e.g., the primary-side-regulation controller 806), a first transmitter (e.g., the transmitter 802), a first receiver (e.g., the receiver 904), one or more first wires (e.g., the wire 860 and/or the wire 862), one or more second wires (e.g., the wire 960 and/or the wire 962), a second controller (e.g., the secondary-side-regulation controller 808), a second receiver (e.g., the receiver 804) connected to the first transmitter (e.g., the transmitter 802) through the one or more first wires (e.g., the wire 860 and/or the wire 862), and a second transmitter (e.g., the transmitter 902) connected to the first receiver (e.g., the receiver 904) through the one or more second wires (e.g., the wire 960 and/or the wire 962). The first controller (e.g., the primary-side-regulation controller 806) is configured to: output a first control signal (e.g., the control signal 864) to a first switch (e.g., the power switch 830) to affect a first current flowing through a primary winding of a power converter; and generate a first input signal (e.g., the input signal 880). The first transmitter (e.g., the transmitter 802) is configured to receive the first input signal and generate a first current (e.g., the current 822) in response to the first input signal. The second receiver (e.g., the receiver 804) includes a first coil (e.g., the coil 610) configured to generate a first magnetic field based at least in part on the first current flowing through the first coil, a first Hall effect sensor (e.g., the Hall effect sensor 630) configured to sense the first magnetic field, and a first comparator (e.g., the comparator 650) configured to receive a first sensor voltage and a second sensor voltage from the first Hall effect sensor. The second receiver (e.g., the receiver 804) is configured to receive the first current and generate a first output signal (e.g., the output voltage 882) based at least in part on the first current. The second controller (e.g., the secondary-side-regulation controller 808) is configured to: receive the first output signal; output a second control signal (e.g., the control signal 866) to a second switch (e.g., the transistor 810) to affect a second current flowing through a secondary winding of the power converter, the secondary winding being coupled to the primary winding; and generate a second input signal (e.g., the input signal 980). The second transmitter (e.g., the transmitter 902) is configured to receive the second input signal and generate a second current (e.g., the current 922) in response to the second input signal. The first receiver (e.g., the receiver 904) includes a second coil (e.g., the coil 710) configured to generate a second magnetic field based at least in part on the second current flowing through the second coil, a second Hall effect sensor (e.g., the Hall effect sensor 730) configured to sense the second magnetic field, and a second comparator (e.g., the comparator 750) configured to receive a third sensor voltage and a fourth sensor voltage from the second Hall effect sensor. The first receiver (e.g., the receiver 904) is configured to receive the second current and generate a second output signal (e.g., the output voltage 982) based at least in part on the second current. The first controller is configured to receive the second output signal. For example, the system is implemented according to at least FIG. 7 and/or FIG. 8.

In certain examples, the first controller (e.g., the primary-side-regulation controller 806), the first transmitter (e.g., the transmitter 802), and the first receiver (e.g., the receiver 904) are located on a first chip, and the second controller (e.g., the secondary-side-regulation controller 808), the second receiver (e.g., the receiver 804), and the second transmitter (e.g., the transmitter 902) are located on a second chip. The first chip and the second chip are different. In some examples, the first controller (e.g., the primary-side-regulation controller 806), the first transmitter (e.g., the transmitter 802), the first receiver (e.g., the receiver 904), the second controller (e.g., the secondary-side-regulation controller 808), the second receiver (e.g., the receiver 804), and the second transmitter (e.g., the transmitter 902) are located on a same chip.

According to certain embodiments, a method for transmitting and receiving includes generating a first current, receiving the first current, generating, by a coil, a magnetic field based at least in part on the first current flowing through the coil, and sensing the magnetic field by a Hall effect sensor. The Hall effect sensor is electrically isolated from the coil. Additionally, the method includes generating a first voltage and a second voltage by the Hall effect sensor, receiving the first voltage and the second voltage, and generating an output voltage based at least in part on the first voltage and the second voltage. For example, the method is implemented according to at least FIG. 3A.

According to some embodiments, a method for a power converter includes outputting a first control signal (e.g., the control signal 464) to a first switch (e.g., the power switch 430) to affect a first current flowing through a primary winding of a power converter, generating an input signal (e.g., the input signal 480), receiving the input signal, generating a current (e.g., the current 422) in response to the input signal, and receiving the current. Additionally, the method includes generating a magnetic field by a coil based at least in part on the current flowing through the coil, sensing the magnetic field by a Hall effect sensor, receiving a first sensor voltage and a second sensor voltage from the Hall effect sensor, and generating an output signal (e.g., the output voltage 482) based at least in part on the first sensor voltage and the second sensor voltage. Moreover, the method includes receiving the output signal, and outputting a second control signal to a second switch (e.g., the transistor 410) to affect a second current flowing through a secondary winding of the power converter. The secondary winding is coupled to the primary winding. For example, the method is implemented according to at least FIG. 4.

According to certain embodiments, a method for a power converter includes outputting a first control signal (e.g., the control signal 566) to a first switch (e.g., the transistor 510) to affect a first current flowing through a secondary winding of a power converter, generating an input signal (e.g., the input signal 580), receiving the input signal, generating a current (e.g., the current 522) in response to the input signal, and receiving the current. Additionally, the method includes generating a magnetic field, by a coil (e.g., the coil 310), based at least in part on the current flowing through the coil, sensing the magnetic field by a Hall effect sensor (e.g., the Hall effect sensor 330), receiving a first sensor voltage and a second sensor voltage from the Hall effect sensor, and generating an output signal (e.g., the output voltage 582) based at least in part on the first sensor voltage and the second sensor voltage. Moreover, the method includes receiving the output signal, and outputting a second control signal (e.g., the control signal 564) to a second switch (e.g., the power switch 530) to affect a second current flowing through a primary winding of the power converter. The primary winding is coupled to the secondary winding. For example, the method is implemented according to at least FIG. 5.

According to some embodiments, a method for a power converter (e.g., the power converter 800 and/or the power converter 1000) includes outputting a first control signal (e.g., the control signal 864) to a first switch (e.g., the power switch 830) to affect a first current flowing through a primary winding of a power converter, generating a first input signal (e.g., the input signal 880), receiving the first input signal, generating a first current (e.g., the current 822) in response to the first input signal, and receiving the first current. Additionally, the method includes generating a first magnetic field, by a first coil (e.g., the coil 610), based at least in part on the first current flowing through the first coil, sensing the first magnetic field by a first Hall effect sensor (e.g., the Hall effect sensor 630), receiving a first sensor voltage and a second sensor voltage from the first Hall effect sensor, generating a first output signal (e.g., the output voltage 882) based at least in part on the first sensor voltage and the second sensor voltage, receiving the first output signal, and outputting a second control signal (e.g., the control signal 866) to a second switch (e.g., the transistor 810) to affect a second current flowing through a secondary winding of the power converter. The secondary winding is coupled to the primary winding. Moreover, the method includes generating a second input signal (e.g., the input signal 980), receiving the second input signal, and generating a second current (e.g., the current 922) in response to the second input signal, receiving the second current. Also, the method includes generating a second magnetic field, by a second coil (e.g., the coil 710), based at least in part on the second current flowing through the second coil, sensing the second magnetic field by a second Hall effect sensor (e.g., the Hall effect sensor 730), receiving a third sensor voltage and a fourth sensor voltage from the second Hall effect sensor, generating a second output signal (e.g., the output voltage 982) based at least in part on the third sensor voltage and the fourth sensor voltage, and receiving the second output signal. For example, the method is implemented according to at least FIG. 7 and/or FIG. 8.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for a power converter, the system comprising:
a first controller;
a first transmitter;
a first receiver;
one or more first wires;
one or more second wires;
a second controller;
a second receiver connected to the first transmitter through the one or more first wires; and
a second transmitter connected to the first receiver through the one or more second wires;
wherein:
the first controller is configured to:
output a first control signal to a first switch to affect a primary current flowing through a primary winding of a power converter; and generate a first input signal; and the first transmitter is configured to receive the first input signal and generate a first current in response to the first input signal;

wherein:

the second receiver includes a first coil configured to generate a first magnetic field based at least in part on the first current flowing through the first coil, a first Hall effect sensor configured to sense the first magnetic field, and a first comparator configured to receive a first sensor voltage and a second sensor voltage from the first Hall effect sensor; and the second receiver is configured to receive the first current and generate a first output signal based at least in part on the first current;

wherein the second controller is configured to:

receive the first output signal;

output a second control signal to a second switch to affect a secondary current flowing through a secondary winding of the power converter, the secondary winding being coupled to the primary winding; and generate a second input signal;

wherein the second transmitter is configured to receive the second input signal and generate a second current in response to the second input signal;

wherein:

the first receiver includes a second coil configured to generate a second magnetic field based at least in part on the second current flowing through the second coil, a second Hall effect sensor configured to sense the second magnetic field, and a second comparator configured to receive a third sensor voltage and a fourth sensor voltage from the second Hall effect sensor; and the first receiver is configured to receive the second current and generate a second output signal based at least in part on the second current;

wherein the first controller is configured to receive the second output signal.

2. The system of claim 1 wherein:

the first controller, the first transmitter, and the first receiver are located on a first chip;

the second controller, the second receiver, and the second transmitter are located on a second chip; and the first chip and the second chip are different.

3. The system of claim 1 wherein the first controller, the first transmitter, the first receiver, the second controller, the second receiver, and the second transmitter are located on a same chip.

4. A method for a power converter, the method comprising:

outputting a first control signal to a first switch to affect a primary current flowing through a primary winding of a power converter;

generating a first input signal;

receiving the first input signal;

generating a first current in response to the first input signal;

receiving the first current;

generating a first magnetic field, by a first coil, based at least in part on the first current flowing through the first coil;

sensing the first magnetic field by a first Hall effect sensor;

receiving a first sensor voltage and a second sensor voltage from the first Hall effect sensor;

generating a first output signal based at least in part on the first sensor voltage and the second sensor voltage;

receiving the first output signal;

outputting a second control signal to a second switch to affect a secondary current flowing through a secondary winding of the power converter, the secondary winding being coupled to the primary winding;

generating a second input signal;

receiving the second input signal;

generating a second current in response to the second input signal;

receiving the second current;

generating a second magnetic field, by a second coil, based at least in part on the second current flowing through the second coil;

sensing the second magnetic field by a second Hall effect sensor;

receiving a third sensor voltage and a fourth sensor voltage from the second Hall effect sensor;

generating a second output signal based at least in part on the third sensor voltage and the fourth sensor voltage; and receiving the second output signal.

* * * * *